(12) United States Patent
Taliashvili et al.

(10) Patent No.: US 7,140,102 B2
(45) Date of Patent: *Nov. 28, 2006

(54) ELECTRODE SANDWICH SEPARATION

(75) Inventors: Zaza Taliashvili, Tbilisi (GE); Avto Tavkhelidze, Tbilisi (GE); Rochel Geller, Ramat Beit Shemesh Aleph (IL); Isaiah Watas Cox, London (GB); Leri Tsakadze, Tbilisi (GE)

(73) Assignee: Borealis Technical Limited (GI)

( * ) Notice: Subject to any disclaimer, the term of this patent is extended or adjusted under 35 U.S.C. 154(b) by 494 days.

This patent is subject to a terminal disclaimer.

(21) Appl. No.: 10/234,498

(22) Filed: Sep. 3, 2002

(65) Prior Publication Data
US 2003/0068431 A1    Apr. 10, 2003

(51) Int. Cl.
*H01R 9/00* (2006.01)

(52) U.S. Cl. .................. 29/842; 29/25.02; 29/831; 29/847; 427/250

(58) Field of Classification Search .............. 29/592.1, 29/25.02, 25.41, 830, 831, 846, 847, 842; 427/250
See application file for complete search history.

(56) References Cited

U.S. PATENT DOCUMENTS

| | | | |
|---|---|---|---|
| 3,740,592 A | | 6/1973 | Engdahl et al. |
| 4,011,582 A | | 3/1977 | Cline et al. |
| 4,063,965 A | * | 12/1977 | Cline et al. .................. 438/455 |
| 4,145,699 A | * | 3/1979 | Hu et al. ...................... 257/35 |
| 4,617,608 A | * | 10/1986 | Blonder et al. ............. 361/291 |
| 5,336,547 A | | 8/1994 | Kawakita et al. |
| 5,917,156 A | | 6/1999 | Nobori et al. |
| 6,214,651 B1 | | 4/2001 | Cox |
| 6,225,205 B1 | * | 5/2001 | Kinoshita ................... 438/613 |
| 6,417,060 B1 | * | 7/2002 | Tavkhelidze et al. ....... 438/380 |
| 6,852,243 B1 | * | 2/2005 | Jurgensen et al. ............ 216/71 |
| 6,971,165 B1 | * | 12/2005 | Tavkhelidze ................ 29/842 |
| 2001/0046749 A1 | | 11/2001 | Tavkhelidze et al. |

FOREIGN PATENT DOCUMENTS

WO    WO 99/13562 A1    3/1999

* cited by examiner

*Primary Examiner*—Carl J. Arbes

(57) ABSTRACT

Materials bonded together are separated using electrical current, thermal stresses, mechanical force, any combination of the above methods, or any other application or removal of energy until the bonds disappear and the materials are separated. In one embodiment the original bonding was composed of two layers of material. In another embodiment, the sandwich was composed of three layers. In a further embodiment, the parts of the sandwich are firmly maintained in their respective positions during the application of current so as to be able to subsequently align the materials relative to one another.

14 Claims, 4 Drawing Sheets

ELECTRODE SANDWICH SEPARATION

BACKGROUND OF THE INVENTION

The present invention relates to fabrication of matching pairs of electrodes.

WO99/13562 and U.S. Pat. No. 6,417,060 disclose applications for which it is beneficial to have two separated surfaces which substantially mirror each other, and methods for making pairs of electrodes whose surfaces replicate each other are disclosed therein. The methods involve fabricating a composite by providing a first electrode with a substantially flat surface and placing a sacrificial layer over it. A second material, which will form the second electrode, is placed over the sacrificial layer. The composite is then 'split' into two matching electrodes by removing the sacrificial layer by etching, by cooling the sandwich with liquid nitrogen, or by heating to evaporate the sacrificial layer.

A possible drawback of using a sacrificial is that it can dull some features of a surface to be matched and thereby degrade the quality of the surface matching. Additionally, incomplete removal of the sacrificial layer, or damage to one of both of the surfaces by the techniques used for removing the layer would be deleterious to the quality of the surface matching.

The present invention offers an improved means for providing paired electrodes that dispenses with the need for a sacrificial layer.

SUMMARY OF THE INVENTION

From the foregoing, it may be appreciated that a need has arisen for a method of separating bonded materials for use as electrodes or for other uses, to achieve clean separation of the two surfaces, which allows the surfaces to remain aligned with one another, and which does not involve a sacrificial layer. This method may be used to prepare matched surfaces that may be positioned in close proximity to each other, with separation distances on an Angstrom scale.

In general terms, the present invention provides a method for manufacturing a pair of electrodes comprising the steps of: fabricating a first electrode with a substantially flat surface: placing a second material over the first electrode, wherein said second material comprises a material that is suitable for use as a second electrode; and separating the composite so formed along the boundary of two layers into two matched electrodes. A technical advantage of the present invention is that surfaces that mirror one another may be created without the need for a sacrificial layer. A further technical advantage of the present invention is that the bonded layers may be separated cleanly, with no remnants of one material on the layer opposing.

In accordance with one embodiment of the present invention, the separation step is achieved by applying an electrical current through the materials to separate the electrodes along the boundary of two layers. A technical advantage of this aspect of the present invention is that bonded materials may be easily separated without applying mechanical tension to the materials.

In accordance with a further embodiment of the present invention, the separation step is achieved by cooling or heating the materials, so that the differential in the Thermal Coefficient of Expansion (TCE) between two materials breaks the adhesive bond between the two materials.

In accordance with a further embodiment of the present invention, the separation step is achieved by forcible separation of the two materials to break the adhesion between the two materials. A technical advantage of this aspect of the present invention is that the method may not involve applying or removing heat during the separation process.

In accordance with the present invention, a method of separating materials from one another is provided, comprising the addition or removal of energy, for example by means of an ultrasonic treatment step.

In accordance with a further embodiment of the present invention, the separation step is achieved by combination of two or more of the prior methods.

The present invention describes a method for separating surfaces. These surfaces could take many forms, including but not limited to electrodes.

The present invention also describes separating bonded surfaces. These surfaces can be bonded through a variety of methods as described in the detailed description of the invention.

Other technical advantages of the present invention will be readily apparent to one skilled in the art from the following figures, descriptions, and claims.

BRIEF DESCRIPTION OF THE SEVERAL VIEWS OF THE INVENTION

Embodiments of the invention will now be described with reference to appropriate figures, which are given by way of example only and are not intended to limit the present invention.

For a more complete explanation of the present invention and the technical advantages thereof, reference is now made to the following description and the accompanying drawings, in which.

Figure 4:
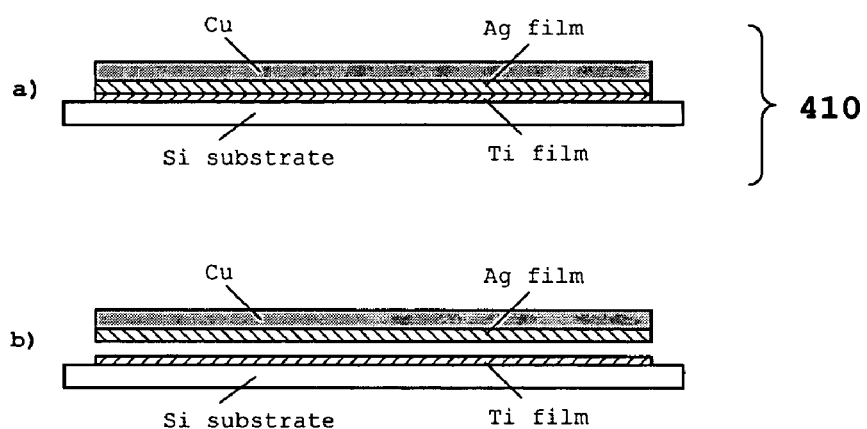

FIG. 4a a shows a composite intermediate.

FIG. 4b a pair of electrodes derived from a composite intermediate.

DETAILED DESCRIPTION OF THE INVENTION

Definitions:

"Power Chip" is hereby defined as a device that uses a thermal gradient of any kind to create an electrical power or energy output. Power Chips may accomplish this using thermionics, thermotunneling, or other methods as described in this application.

"Cool Chip" is hereby defined as a device that uses electrical power or energy to pump heat, thereby creating, maintaining, or degrading a thermal gradient. Cool Chips may accomplish this using thermionics, thermotunneling, or other methods as described in this application.

"Gap Diode" is defined as any diode which employs a gap between the anode and the cathode, or the collector and emitter, and which causes or allows electrons to be transported between the two electrodes, across or through the gap, The gap may or may not have a vacuum between the two electrodes, though Gap Diodes specifically exclude bulk liquids or bulk solids in between the anode and cathode. The Gap Diode may be used for Power Chips or Cool Chips, for devices that are capable of operating as both Power Chips and Cool Chips, or for other diode applications.

Figure 1:
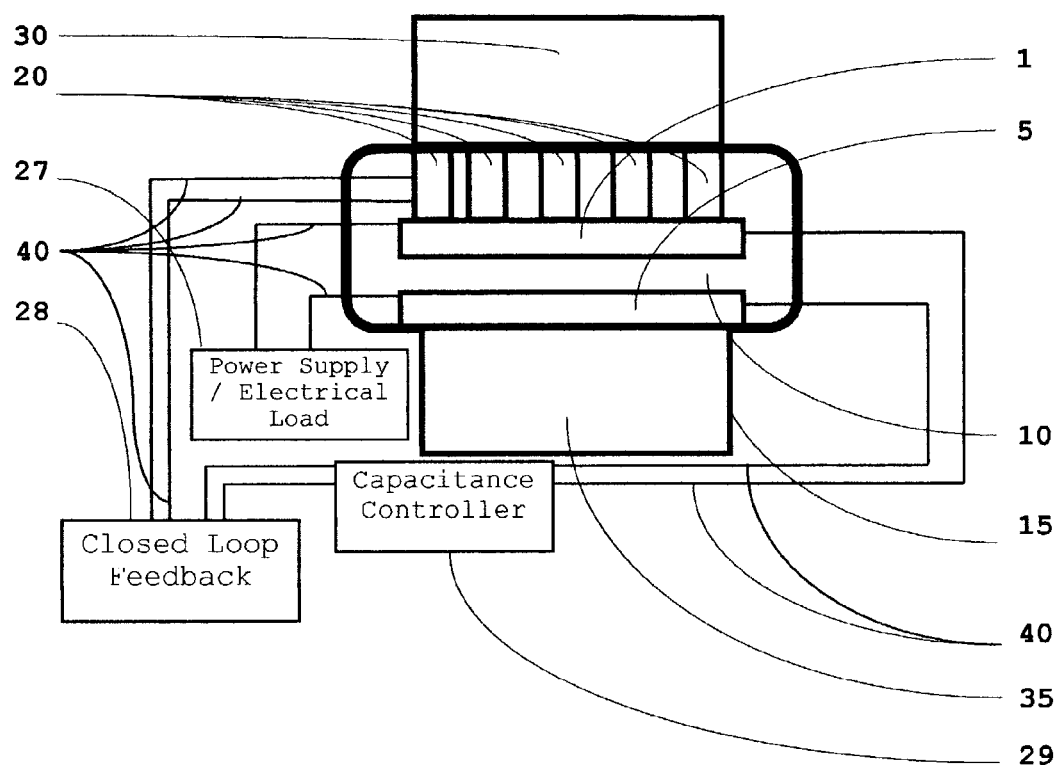
FIG. 1 is a diagrammatic representation of one embodiment of the electrode configuration of a Gap Diode, Power Chip or Cool Chip, showing piezo-electric actuators at intervals along the under-surface of an electrode.

The embodiments of the present invention and its technical advantages are best understood by referring to FIGS. 1–4. While in this description of the present invention specific methods are disclosed for separating a composite electrode intermediate into two matched electrodes, these should not be construed as limiting the scope of the invention but as merely providing illustrations of some of the presently preferred embodiments of this invention. Similarly, although FIGS. 1 and 2 show schematics of various diode devices described in U.S. Pat. No. 6,417,060, which use actuators, preferably piezo-electric actuators, to control the separation of the electrodes, these also should not be construed as limiting the scope of the invention but as merely providing illustrations of some of the presently preferred embodiments of this invention.

Further, electrode pairs fabricated according to the methods of the present invention may be used in a number of devices, as stated herein, including, for example, (i) a device which uses a thermal gradient of any kind to generate electrical power or energy output using thermionics, thermotunneling, or other methods as described herein; (ii) a device which uses electrical power or energy to pump heat, thereby creating, maintaining, or degrading a thermal gradient using thermionics, thermotunneling, or other methods as described herein; and (iii) as any diode which employs a gap between the anode and the cathode, or the collector and emitter, and which causes or allows electrons to be transported between the two electrons, across or through the gap (with or without a vacuum in the gap). Alternatively, the device of the present invention may be integrated into or used for any ordinary diode applications.

Further, when surface features of two facing surfaces of electrodes are described as "matching" it means that where one surface has an indentation, the other surface has a protrusion and vice versa, Thus when "matched," the two surfaces are substantially equidistant from each other throughout their operating range.

Referring now to FIG. 1, two electrodes 1 and 5 are separated by a region 10 and housed in a housing 15. Electrode 1 is attached to a number of piezo-electric actuators 20 at intervals. An electric field is applied to the piezo-electric actuators via connecting wires 40 which causes them to expand or contract longitudinally, thereby altering the longitudinal distance of region 10 between electrodes 1 and 5. Electrodes 1 and 5 are connected to capacitance controller 29, which both modifies the piezo-electric actuator 20, and can give feedback to a power supply/electrical load 27 to modify the heat pumping action, and generating action, respectively. Applying an electric field to piezo-electric actuators 20 controls the longitudinal distance of region 10 between electrodes 1 and 5. The capacitance between emitter 1 and collector 5 is measured and controlling circuitry 29 adjusts the field applied to piezo-electric actuators 20 to hold the capacitance, and consequently the distance between the electrodes 10, at a predetermined fixed value. Alternatively, the controller 29 may be set to maximize the capacitance and thereby minimize the distance 10 between the electrodes. The diagram shown in FIG. 1 can be used as a thermionic device and/or as a tunneling device, and can be used to function as a Power Chip and/or as a Cool Chip. Capacitance controller 29 may be composed of multiple elements, and each piezo-electric actuator 20 may receive its own distinct signal, independent from the control of surrounding elements.

As disclosed in the foregoing, actuator elements facilitate the close positioning of the electrodes, and if the electrode pairs are matched, then it is possible to move them into sufficiently close proximity to allow tunneling to occur. WO99/13562 and U.S. Pat. No. 6,417,060 disclose methods for making pairs of electrodes whose surfaces are so matched. The present invention further improves on these processes.

The present invention describes a method for separating materials that have been bonded together (FIGS. 2a–e). The bonding could take many forms. For example, one layer could have been added to another layer by deposition, sputtering, or other method known in the art. It will be appreciated that when the term "bonding" is used herein, such term can include any form of adhesion that can be separated according to the method of the present invention.

Figure 3:
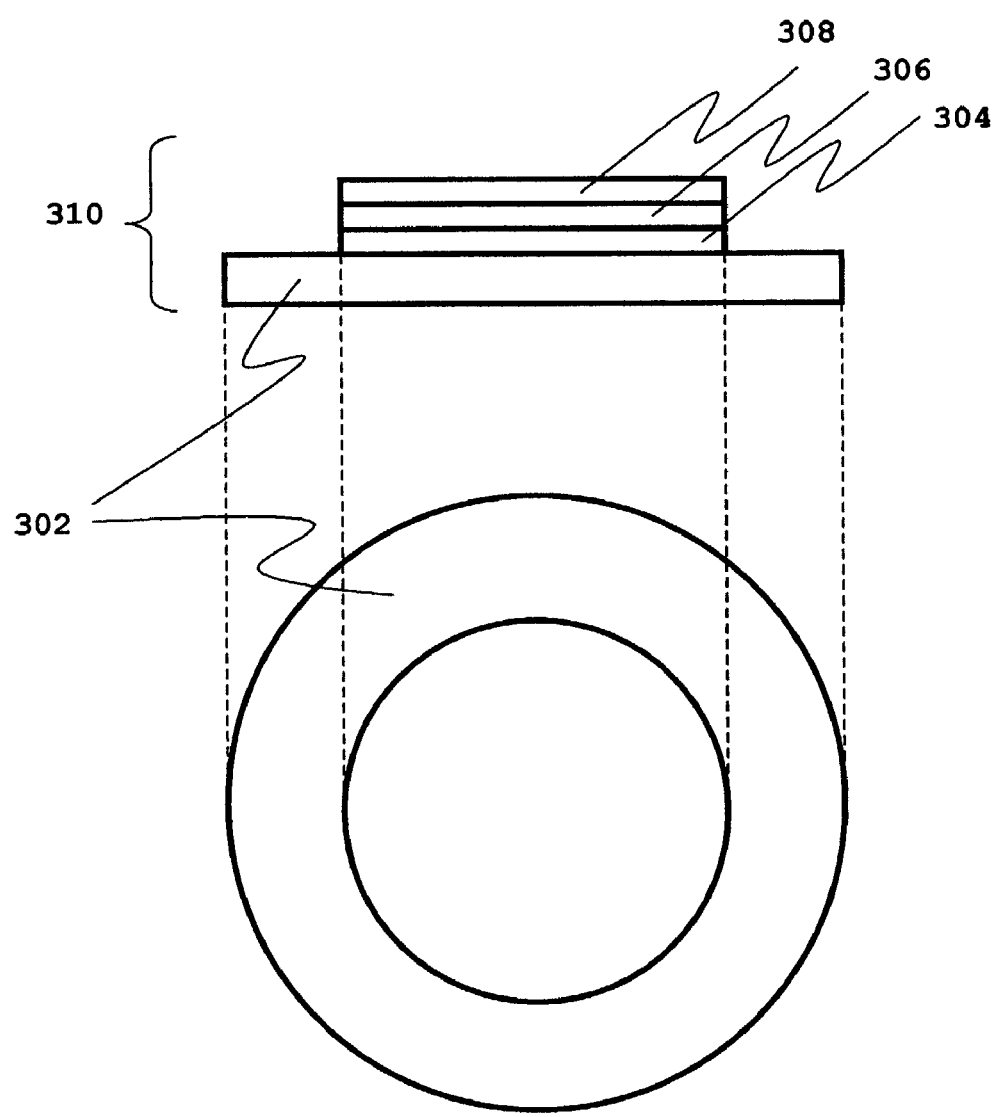
FIG. 3 is a diagrammatic representation of an electrode composite on a silicon wafer.

The method of the present invention may be understood by referring to FIG. 3, which shows a composite comprising two thin films deposited one over the other using vacuum deposition methods. The composite may be separated by the application of current, by cooling or heating, by the application of mechanical force, by a combination of any of the above methods or by any other addition or removal of energy, such as by exposure to an ultrasonic source.

The method of the present invention may be further understood by referring to FIG. 3, in which a layer of titanium 304 is deposited on substrate 302. A layer of silver 306 is further deposited on the layer of titanium. A further layer of copper 308 is grown electrochemically on the layer of silver. In a similar fashion to the processes exemplified in FIG. 3b, the composite 310 shown in FIG. 3 is heated or cooled, causing it to be split into two a pair of matching electrodes. A detailed example is given below.

Alternatively, the composite may be split by the application of electrical current. Typical values are of the order of 0.1 amps/cm$^2$ and 0.1V.

To facilitate separation of the composite 310 into electrode pairs, the composite may be placed in the apparatus shown in FIG. 1, and piezo-electric actuators 20 attached to one side of the composite, and used to draw the two apart as the composite is heated, cooled or exposed to an electric current. This ensures that the two electrodes are then in the correct orientation to be moved back into close juxtaposition to each other by the piezo-electric actuators. The gap may be, for example less than 50 nanometers, less than 100 angstroms, or less than 50 angstroms in distance.

Figure 2A:
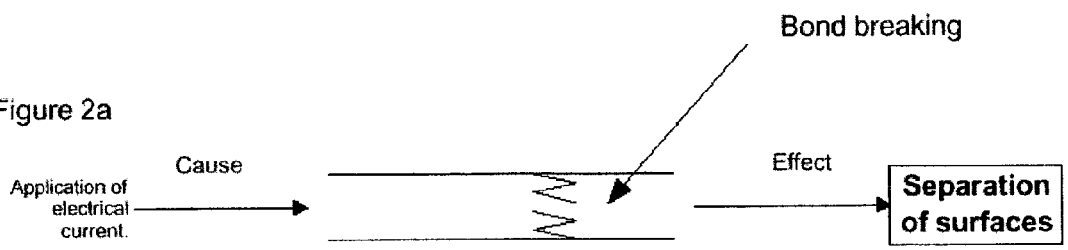
FIG. 2a illustrates two bonded materials undergoing an electrical current application, which breaks the bonds between the materials.

The types of materials that can be separated in this manner are many and various. In one experiment, a silicon substrate was prepared and thin films of silver and titanium deposited upon it. The thin films were separated from one another by an electrical current applied through them (FIG. 2a). In other embodiments, other materials could be substituted, or the materials could consist of thicker films or be bulk materials.

Figure 2B:
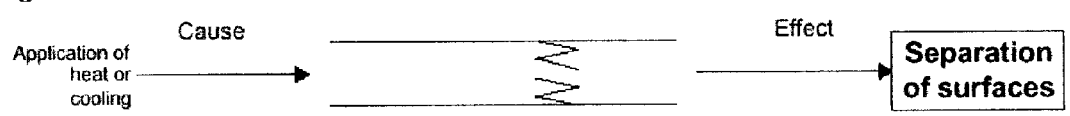
FIG. 2b illustrates two bonded materials undergoing a thermal cycle, which breaks the bonds between the materials.
Figure 2C:
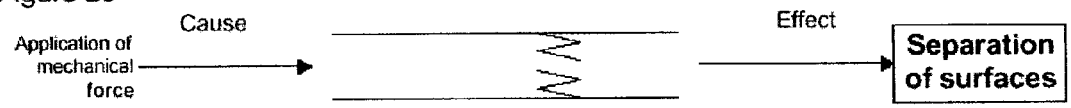
FIG. 2c illustrates two bonded materials undergoing an application of mechanical force, which breaks the bonds between the materials.
Figure 2D:
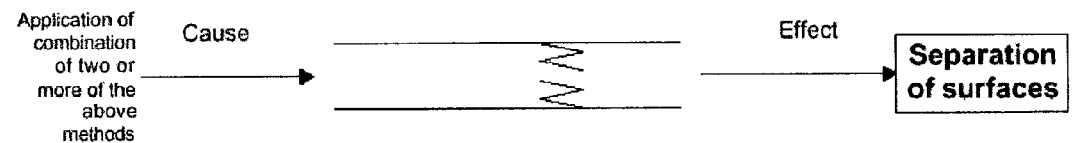
FIG. 2d illustrates two bonded materials undergoing a combination of two or more of the prior methods, which breaks the bonds between the materials.
Figure 2E:
FIG. 2e illustrates energy being applied to two bonded materials, which breaks the bonds between the materials.

Experimentally, it was found that applying liquid nitrogen to the materials also successfully separated the respective layers (FIG. 2b).

Experiments were conducted in which the materials began with a relatively low degree of adhesion. However, this does not imply that the present invention is not equally applicable were the degree of adhesion higher, or were the materials adhered in a different manner. Variations in the strength and duration of current and voltage, as well as the duration and temperature of thermal cycling will yield varying results.

One particularly useful embodiment involves the separation of two intended electrodes from one another, for use in vacuum diode applications. The two electrodes, initially bonded together, are intended to be positioned substantially opposite one another with a spacing between the two on the order of a few nanometers. The two facing surfaces must substantially mirror one another. The method of the present invention allows the bonding between them to be removed without moving them physically and without possibly distorting their surfaces by applying heating or cooling or chemical methods. In this way they may subsequently be positioned more easily for their use in vacuum diode applications.

In another embodiment, the initial bonded materials consist of more than two layers, for example two layers with a sacrificial layer in between. In some events it may be desired to separate all three materials from one another. In other situations, just one of the layers must be separated from the sacrificial layer by the method of the present invention, whilst the second layer is separated from the sacrificial layer by a different method. In a further embodiment a mold is first made, and then other materials are deposited upon the mold, and subsequently separated therefrom by the method of applying electrical current or other methods of applying or removing energy, as will be described. It will be appreciated that the method and materials involved may vary in their details without departing from the basic concepts disclosed herein.

Another particularly useful embodiment is to provide a mold for the creation of electrodes or similar surfaces. An initial surface is prepared, of desired configuration. This surface is comprised of a material which will not be damaged by subsequent deposition of other materials upon it. As a particularly preferred embodiment, a second durable material is deposited upon the initial surface, and separated therefrom by the application of current or thermal stresses, as described above. Then, the initial surface is used as a mold for the creation of surfaces that mirror it identically. In the particularly preferred embodiment, both the initial and the second materials' surfaces are used as molds, and they thus each create new surfaces that mirror each other. If used as electrodes, these new surfaces will still require positioning relative to one another, but it will likely prove cost effective for surfaces to be formed using a mold in this way.

The present invention provides for the making of electrodes or other matching pairs of surfaces. Methods for initially preparing the bonded materials which subsequently require separation include many techniques, such as vacuum deposition, sputtering, etc. The present invention does not have to be used in isolation from housing electrodes in a vacuum. For example, the bonded electrodes could be housed in a vacuum, having electrical connections from each, and subsequently brought out of the vacuum. Only then, applying an electrical current through the electrical connections, would one separate the electrodes from each other.

It is anticipated that in the present embodiment example, it will be necessary to bond the housing and the electrical connections to the electrodes with a greater degree of adhesion than that which exists between the electrodes. This is so that upon the application of current, it will be the electrodes that separate from one another, and not the electrical connections or the housing separating from the electrodes. For thermal cycling, the adhesion could be made stronger, or alternatively, the TCE between the materials can be matched so that thermal cycling introduces little or no mechanical stress on the connection.

This feature may be used to an advantage in other embodiments. For example, two insulating substrates can be prepared with an indentation in the center. Two types of filling material are prepared, and one type is deposited in each of the substrates, to fill the indentations. The two substrates are then sealed, in a manner which effectively bonds together the two filling materials to one another. However, the substrates and filling materials have been chosen so that the degree of adhesion between the filling materials will be less than that between the two substrates. Electrical current, cooling or heating or other energy is applied to the entire device, to the degree that the filling materials separate from one another but the outer substrates maintain their seal. The result is a vacuum with two separated filling materials. One use for such a device is in vacuum diode applications.

A triode comprising three electrodes in series can similarly be prepared, beginning as three materials initially bonded together. In other embodiments, for use as electrodes, or for a variety of uses, a larger plurality of initially bonded materials may be separated according to the method of the present invention.

A related embodiment is that a substrate may be prepared, with one or more thin films on top of it. The thin films match the TCE of the substrate beneath it. Subsequent thin films may be deposited before a thicker layer, comprising the bulk of the second material. One pair of layers within the sandwich will have a low adhesion, and the two surfaces may be moved away from each other after that adhesion is broken, either by passing an electrical current, by cooling or heating and/or by other method of applying or removing energy to or from part of all of the materials. It has been observed that when this occurs, it results in an audible sound.

Thin films of materials have been experimentally separated by the method of the present invention. However, it is anticipated that thick films or bulk materials will also be separable.

EXAMPLE

Referring to FIG. 4a which shows a composite intermediate 410, a doped silicon wafer is used as the substrate. The dopant is n type, and the conductivity of the doped silicon is on the order of 0.05 Ohm cm. A 0.1 µm thick titanium film is deposited over the silicon substrate using DC magnetron sputtering method. A round metallic mask with a diameter of 28 mm is used for the titanium film deposition. After deposition, the titanium is backed with silicon to achieve maximum adhesion of the titanium film to the silicon substrate. Next is the in situ deposition of 1 µm thick silver film using the same method. Deposition regimes for silver are chosen to achieve optimum adhesion of silver to the titanium film. (The optimum adhesion is much less than the adhesion usually used in microelectronics processes.) A layer of copper 500 μm thick is grown electrochemically on the silver film. The copper is grown using ordinary electrochemical growth.

Next, the sandwich on the border of titanium and silver films is opened (FIG. 4b). Once we have low adhesion between the titanium and silver films, the sandwich opens without considerable deformation of the electrodes. In this way, two conformal electrodes are fabricated. With conformal electrodes it is then possible to achieve tunneling currents over broad areas of the electrodes.

The process uses metallic masks to define the shape of the films to avoid exposing the samples to the atmosphere. This simplifies sample preparation and avoids problems connected with the cleaning of the electrode surfaces.

The sandwich is opened after the sandwich is placed in a sealed area and it is pumped down. By not exposing the electrode surfaces to the atmosphere, oxidation is avoided. The sandwich is opened by cooling it down in a vacuum from room temperature to approximately 0° C. or heating it up to 40° C. Because copper and silicon have different Thermal Expansion coefficients (TEC) the two electrodes separate in the process of cooling or heating. If the adhesion between the titanium and silver films is low enough, the sandwich opens without leaving considerable deformation in the electrodes. On the other hand, the adhesion of silver to titanium must be high enough to prevent electrochemical liquid from entering between the films during the electrochemical growth of copper. Precise adhesion control between the titanium and silver films is therefore important.

Thus, it is apparent that there is provided, in accordance with the present invention, a method for separating materials that have been bonded together, that satisfies in each embodiment one or more of the advantages set forth above.

While this invention has been described with reference to numerous embodiments, it is to be understood that this description is not intended to be construed in a limiting sense. Various modifications and combinations of the illustrative embodiments will be apparent to persons skilled in the art upon reference to this description. It is to be further understood, therefore, that numerous changes in the details of the embodiments of the present invention and additional embodiments of the present invention will be apparent to, and may be made by, persons of ordinary skill in the art having reference to this description. It is contemplated that all such changes and additional embodiments are within the spirit and true scope of the invention as claimed below.

All publications and patent applications mentioned in this specification are indicative of the level of skill of those skilled in the art to which this invention pertains. All publications and patent applications are herein incorporated by reference to the same extent as if each individual publication or patent application was specifically and individually indicated to be incorporated by reference.

The invention claimed is:

1. A method for manufacturing a pair of matching electrodes, said method comprising the steps of:

a) providing a first electrode;
   b) placing a material over said first electrode, wherein said material comprises a material that is suitable for use as a second electrode, whereby a composite is formed; and
   c) separating the composite along a boundary between said first electrode and said second material.

2. The method of claim 1 wherein said step of separating the composite comprises applying an electric current between said first electrode and said material.

3. The method of claim 1 wherein said step of separating the composite comprises heating said composite.

4. The method of claim 3, wherein said heating step comprises heating the composite to a temperature of 40° C. or more.

5. The method of claim 1 wherein said step of separating the composite comprises cooling said composite.

6. The method of claim 5, wherein said cooling step comprises cooling the composite to a temperature of 0° C. or less.

7. The method of claim 1 wherein said step of separating the composite comprises applying or removing energy to or from the composite.

8. The method of claim 7 wherein said step of applying energy comprises exposing the composite to an ultrasonic energy source.

9. The method of claim 1 wherein said step of separating the composite comprises applying a mechanical force.

10. The method of claim 1 wherein said first electrode comprises titanium.

11. The method of claim 1 wherein said material comprises silver.

12. The method of claim 1, further comprising the steps of:

a) attaching said first electrode or said material to one or more actuators; and
   b) using said actuator to apply a mechanical force, thereby separating said composite.

13. The method of claim 1, further comprising the steps of:

a) attaching said first electrode or said material to one or more actuators; and
   b) using said actuator to maintain a region between said first and second electrodes after said separating step, wherein topographical features on the surface of said first electrode are maintained in spatial orientation with a matching topographical feature on said second electrode.

14. The method of claim 1, wherein said step of separating the composite comprises using any combination of the following methods:

a) applying an electrical current to the composite;
   b) cooling the composite;
   c) heating the composite; and
   d) forcibly separating the composite.

* * * * *